United States Patent [19]
Beratan et al.

[11] Patent Number: 5,403,437
[45] Date of Patent: Apr. 4, 1995

[54] FLUOROSURFACTANT IN PHOTORESIST FOR AMORPHOUS "TEFLON" PATTERNING

[75] Inventors: Howard R. Beratan; Chih-Chen Cho, both of Richardson; Scott R. Summerfelt, Dallas, all of Tex.

[73] Assignee: Texas Instruments Incorporated, Dallas, Tex.

[21] Appl. No.: 148,773

[22] Filed: Nov. 5, 1993

[51] Int. Cl.$^6$ .......................... B44C 1/22; B29C 37/00
[52] U.S. Cl. ................................. 156/655; 156/659.1; 156/668; 156/904
[58] Field of Search ................. 428/469; 156/651, 655, 156/659.1, 668, 904

[56] References Cited

U.S. PATENT DOCUMENTS 5,298,114  3/1994  Takeshita et al. ................... 156/668

Primary Examiner—William Powell
Attorney, Agent, or Firm—Ruben C. DeLeon; James C. Kesterson; Richard L. Donaldson

[57] ABSTRACT

This is a device and method of forming such, wherein the device has an amorphous "TEFLON" (TFE AF) layer. The method comprising: depositing an TFE AF layer 36 on a substrate; combining a fluorosurfactant with a first material to produce a second material 38; and depositing the second material 38 on the TFE AF layer 36. The method may include: patterning and etching the second material; removing the second material; and forming a third material 42 on the TFE AF layer 44. The third material may be a metal or a semiconductor. The ZFSNF fluorosurfactant may be combined with a photoresist and then patterned and etched. The TFE AF layer may also be heated. A second coating of the second material may also be added.

15 Claims, 3 Drawing Sheets

PATTERNED FSN-PHOTORESIST ON TFE AF

PATTERNED FSN-PHOTORESIST ON TFE AF

H₂O, 5% FSN + H₂O ON AS-DEPOSITED TFE AF

FLUOROSURFACTANT IN PHOTORESIST FOR AMORPHOUS "TEFLON" PATTERNING

FIELD OF THE INVENTION

This invention is directed towards the field of fabrication of electronic and optoelectronic components.

BACKGROUND OF THE INVENTION

As device geometries continue to decrease in electronics and optoelectronics, capacitance density will increase and the performance of integrated circuits will be limited by the high RC time constants caused by high resistivity metals and high capacitance interlevel dielectrics (ILD). Reducing the dielectric constant of the interlevel insulator will not only enhance performance, but also decrease the power consumption and crosstalk of electronic/optoelectronic devices.

For a given interconnect layout, both power dissipation and crosstalk decrease as the dielectric constant of the insulator decreases. FIG. 1 shows the power dissipation of 0.25 μm and 0.50 μm metal lines when different ILDs are used. The data show that using the same dielectric, scaling down from 0.50 μm to 0.25 μm will result in a 30% increase in power dissipation. The power dissipation can be decreased more than 50% if $SiO_2$ ILD is replaced by a copolymer made from tetra-flouroethylene and 2,2-bis(trifluoromethyl)-4,5-difluoro-1,3-dioxole (TFE AF). (TFE AF is commercially available from "DU PONT" in a product known as amorphous "TEFLON"; "TEFLON" is a polymer made from polytetrafluoroethylene (PTFE) also commercially available from "DU PONT"). This change is particularly important for high frequency operation because power dissipation increases proportional to frequency. The power consumption can be further reduced if a metal of lower resistance, such as Cu, is used to replace current metalization materials such as Al or W.

FIG. 2 shows the crosstalk between 0.25 μm and 0.5 μm metal lines when the power supply voltage ($V_{cc}$) is 1 V. The crosstalk increases more than 50% when the design rule is reduced from 0.5 μm to 0.25 μm, primarily due to the increase in line-to-line capacitance. The increase in crosstalk/$V_{cc}$ ratio degrades the noise margin and hence circuit performance. Replacing $SiO_2$ by TFE AF will significantly reduce crosstalk.

Several material properties are required for a successful low-$\epsilon_\gamma$ technology. These include: 1) low dielectric constant, 2) high mechanical strength, 3) good thermal stability, 4) high dielectric strength and low leakage current, 5) low stress, 6) good adhesion, 7) good gap filling capability/ease of planarization, 8) ease of pattern and etch, 9) low water absorptivity, 10) good etch selectivity to metal and 11) good thermal conductivity. A list of a few important properties of TFE AF, PTFE and $SiO_2$ are given in Table 1. The properties of PTFE and $SiO_2$ are listed for comparison.

TABLE 1

| Requirements | TFE AF | PTFE | $SiO_2$ |
| --- | --- | --- | --- |
| Dielectric Constant | 1.9 | 2.1 | 3.5–4.0 |
| Dissipation Factor | <0.00035 | <0.0002 | 0.001 |
| Stable Temperature | 360° C. | 380° C. | 1600° C. |
| Creep Resistance | good | poor | good |
| Resistivity (ohm-cm) | >$10^{18}$ | >$10^{18}$ | $10^{14-17}$ |
| Dielectric Strength | 0.2 (MV/cm) | 1.3 | 5–8 |
| Thermal Conductivity |  |  | 0.012 |
| Chemical Resistance | excellent | excellent |  |
| Water Absorption | <0.01% | <0.01% |  |

No single polymer exhibits all of the required characteristics. TFE AF has the lowest dielectric constant in known polymers. In addition, TFE AF has processing advantages.

Unlike PTFE, which is formed by molding, TFE AF can be deposited as a thin film by either spin-coating, thermolysis or laser ablation. This makes it more applicable to integrated circuits. TFE AF exhibits better creep resistance, a lower dielectric constant, lower thermal expansion and higher tensile strength than PTFE. Good chemical resistance and low water absorption are common for both materials.

SUMMARY OF THE INVENTION

TFE AF films can be deposited on Al, $SiO_2$, $Si_3N_4$, Si and other semiconductor substrates by spin-coating, using TFE AF. The thickness of the films can be varied from <5 nm to >1200 nm by diluting the TFE AF solution with Fluorinert FC-75 (made by "3M"). In addition, the thickness of the films can be controlled by using different spin speeds. Initial results indicate all films on the above-listed substrates pass the Scotch tape test. In contrast, films deposited on the TFE AF layers tend to peel off during subsequent processing. In fact, the TFE AF surface is so non-sticky that photoresist could not be put on by spin-coating. In addition to the problem of putting on patterned photoresist, the TFE AF films have to be etchable. However, since the TFE AF has good chemical resistance, it is difficult to etch by wet chemicals. Finally, since the surface of a spin-coated TFE AF films is wavy, it may be necessary to planarize the films by an etch-back process. That also demands an etching process.

Accordingly, improvements which increase the patternability, etchibility and adhesion of TFE AF are presently desirable. The present invention is directed towards meeting those needs.

Zonyl FSN Fluorosurfactant (Zonyl FSN Fluorosurfactant contains Telomer B monoether with polyethylene glycol in isopropyl alcohol and water; and will be called ZFSNF from now on), an adhesion promoter also made by Du Pont can be combined with TFE AF to help other films adhere to the TFE AF. By adding 5% ZFSNF to a photoresist solution and applying the photoresist on TFE AF at 70° C., a coverage of approximately 98% can be obtained. Full coverage was obtained by applying the photoresist solution twice. The addition of the surfactant does not interfere with subsequent patterning processes. The surfactant can be rinsed off after patterning to restore the original surface properties of the TFE AF films. In addition, the surfactant could be added to films, other than photoresist, deposited on top of the TFE AF film to promote adhesion.

This is a device and method of forming such, wherein the device has an TFE AF layer. The method comprising: depositing an TFE AF layer on a substrate; combining a fluorosurfactant with a first material to produce a second material; and depositing the second material on the TFE AF layer. The method may include: patterning and etching the second material; removing the second material; and forming a third material on the TFE AF layer. The third material may be a metal or a semiconductor. The ZFSNF surfactant may be combined with a photoresist and then patterned and etched. The TFE AF layer may also be heated. A second coating of the second material may also be added.

BRIEF DESCRIPTION OF THE DRAWINGS

The foregoing and further aspects of the invention are illustrated in the accompanying drawings wherein like elements are denoted by like reference designators and in which.

DETAILED DESCRIPTION OF THE PREFERRED EMBODIMENTS

Five types of Zonyl fluorosurfactants (FSA, FSJ, FSN, FSO, and FSP, all manufactured by "DU PONT") were tested. When these surfactants were spin-coated on TFE AF films on Si wafers, all the surfactants wetted the films, but beads or rough residues are observed in all the surfactant layers except for the ZFSNF layer.

When the ZFSNF surfactant was added in a photoresist solution (e.g. AZ1350), the wettability of the solution on TFE AF films significantly improved. Without the ZFSNF surfactant, the photoresist can not stay on the films during the spin-on process (typical rotation speed is 3000 rpm). With the surfactant, the photoresist can be spinned on the TFE AF films and covered most of the surface of the TFE AF films.

When 1% ZFSNF surfactant was added in the photoresist solution, the solution covers approximately 80% of the TFE AF film surface. The bare area is reduced to about 5% when 10% ZFSNF surfactant was added in the photoresist solution. Using 15% ZFSNF added in photoresist, the photoresist can cover the whole surface of the TFE AF film, but a very rough surface and a nonuniform distribution of the photoresist is observed.

Two methods were used to improve the photoresist coverage. The first method involves a double coating process. After the ZFSNF-added photoresist was coated on the TFE AF film and baked at about 110° C. to get rid of the solvent, a second photoresist coating was carried out on the photoresist coated TFE AF film. The second coating was able to reduce the bare area to less than 2% when 5% ZFSNF-added photoresist was used.

The second method employed hot TFE AF films. It was found that when the TFE AF films was at about 70° C., the ZFSNF-added photoresist was able to cover the TFE AF films more effectively. The TFE AF film can be brought up to 70° C. by baking the film at about 110° C. and then taking film to the spinner before it cools or by using a heated substrate holder during spin-coating.

Both methods can be combined, or used separately to improve the coverage of the photoresist on the TFE AF films.

Figure 1:
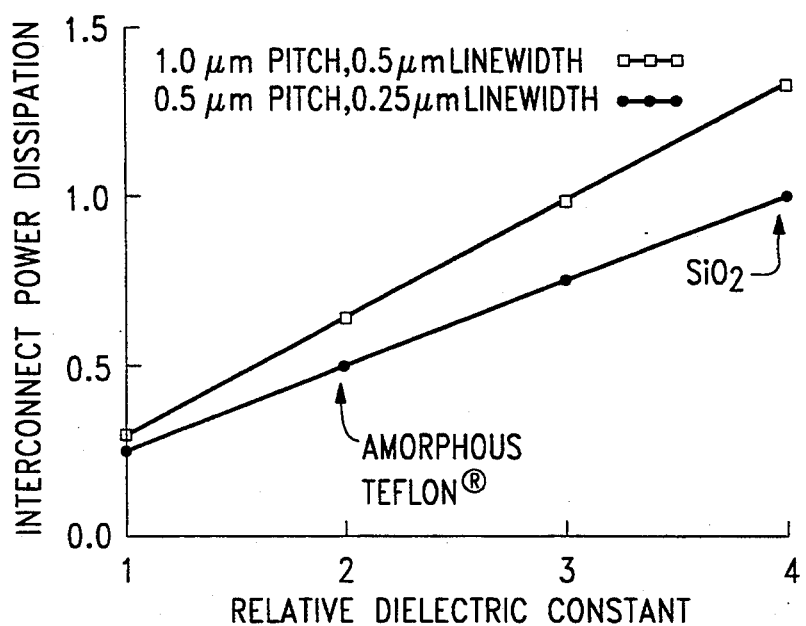
FIG. 1 is a graph of the power dissipation of 0.25 μm and 0.50 μm metal lines when different ILDs are used.
Figure 2:
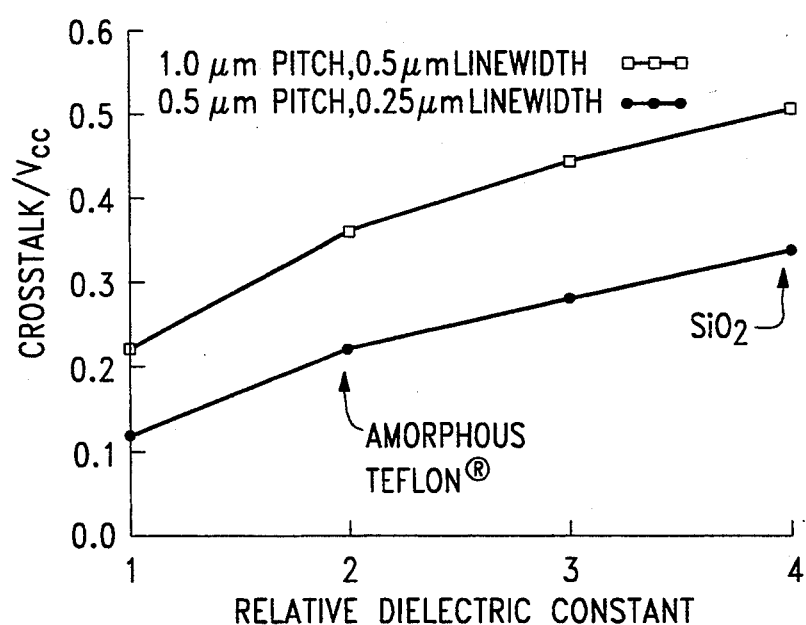
FIG. 2 is a graph of the crosstalk between 0.25 μm and 0.5 μm metal lines when the power supply voltage ($V_{cc}$) is 1 V.
Figure 3:
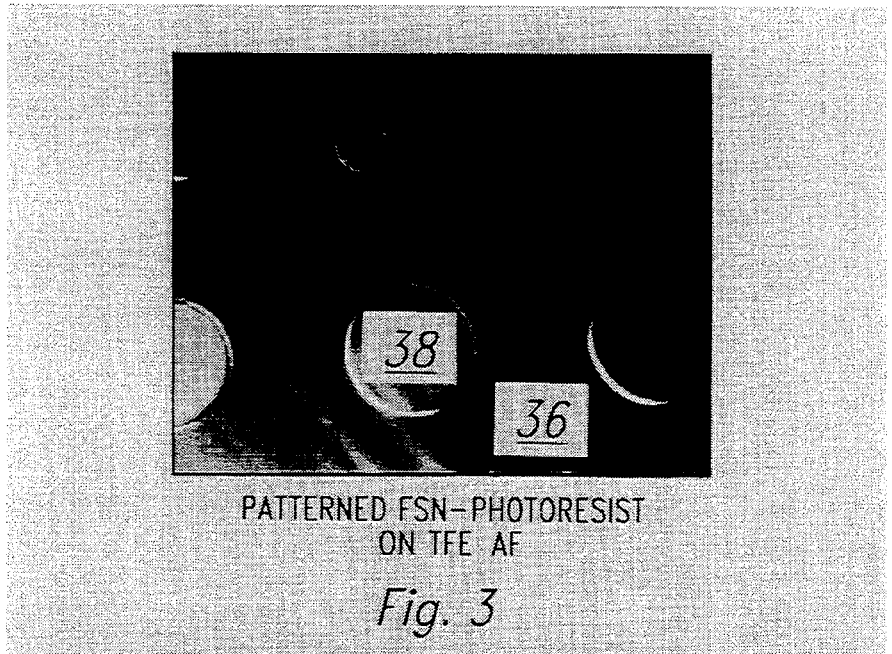
FIG. 3 is a micrograph showing a patterned ZFSNF-added photoresist on a TFE AF film coated on Al/Si(100) wafers.

FIG. 3 shows a patterned ZFSNF-added photoresist 38 on a TFE AF film 36 coated on Al/Si(100) wafers. The ZFSNF-added photoresist was spin-coated by the double-coating method.

Figure 4:
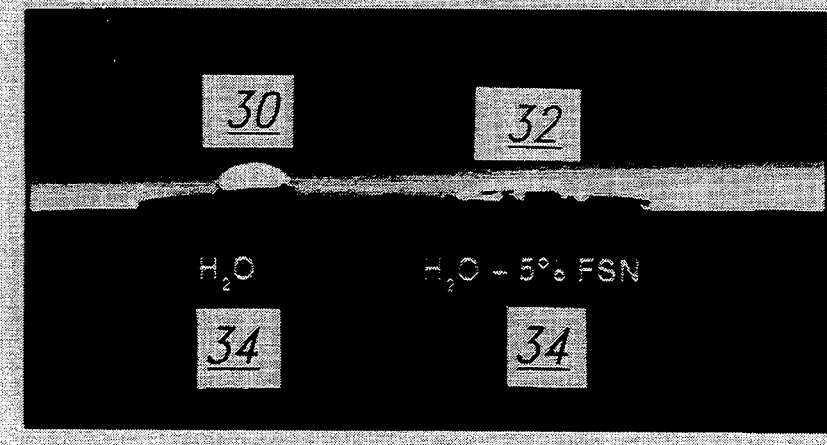
FIG. 4 is a micrograph showing the contact angle of distilled water on a TFE AF film and the contact angle of a 5% ZFSNF water solution.
Figure 7:
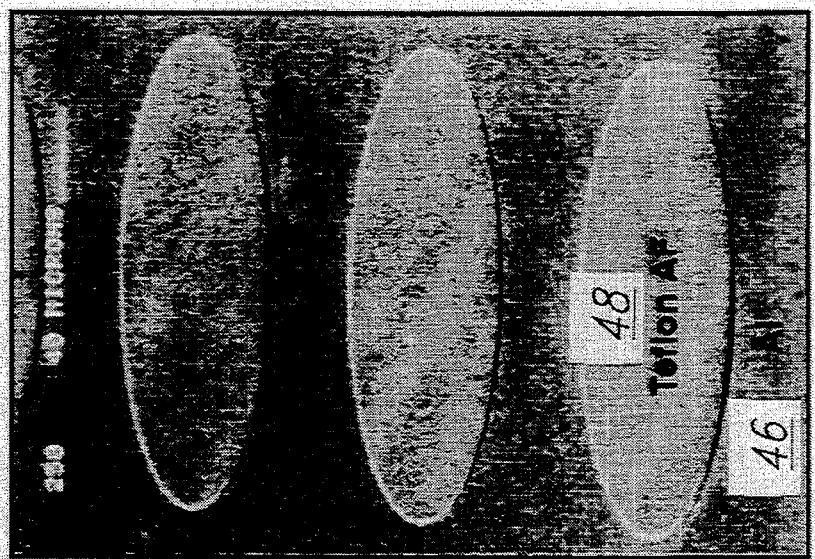
FIG. 7 is a micrograph of a TFE AF mesa built in accordance with the invention.

FIG. 4 shows that the contact angle of distilled water 30 on a TFE AF film 34 can be significantly changed when 5% ZFSNF surfactant was added to the water 32. The surfactant clearly improves the wettability of the water on the TFE AF film 34. Similar improvement in photoresist solutions can be achieved when the surfactant is added in the solutions.

Figure 6:
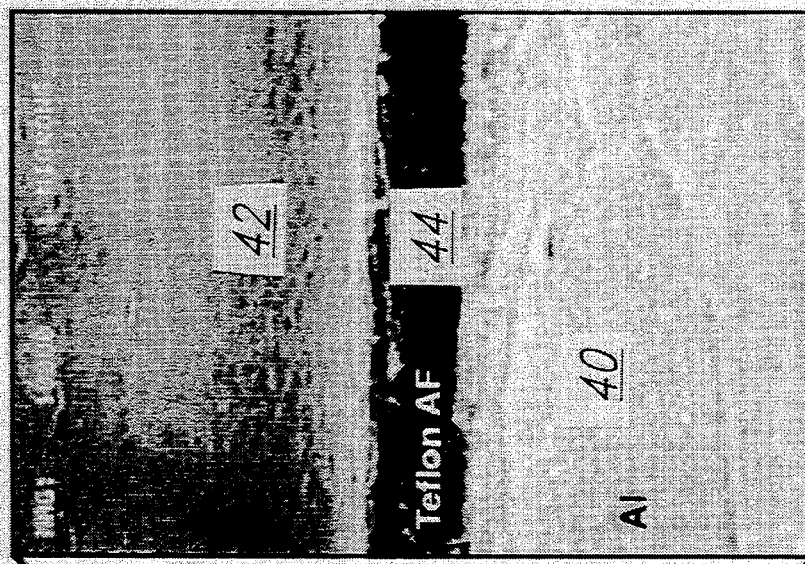
FIG. 6 is a micrograph of the edge of the capacitor in FIG. 5.
Figure 5:
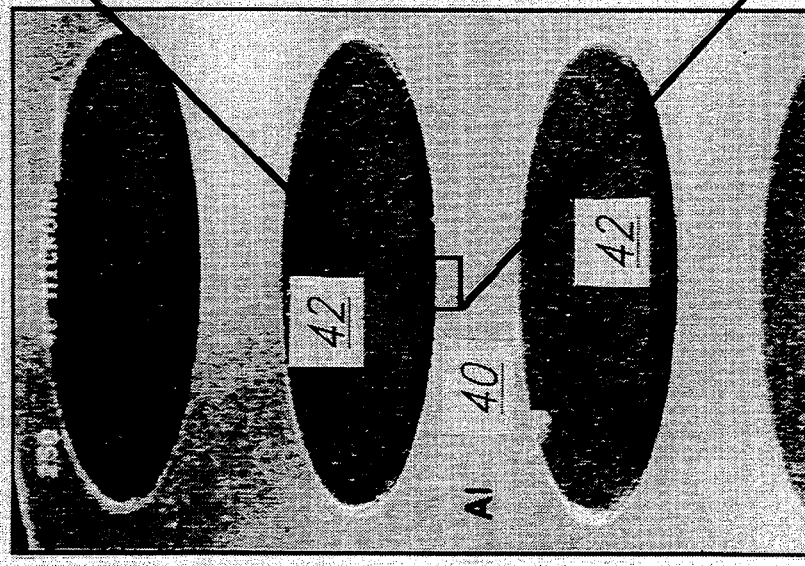
FIG. 5 is a micrograph of a Al/TFE AF/Al/Si(100) capacitors built in accordance the invention.

This procedure can also be used to fabricate the Al/TFE AF/Al/Si(100) capacitors shown in FIG. 5. FIG. 5 shows a TFE AF 44 layer over an Al 40 layer. A second Al 42 layer is on top of the patterned TFE AF 44 layer. The edge of the capacitor in FIG. 5 is shown in FIG. 6. The same process can be used to form the TFE AF 48 mesa as shown in FIG. 6. FIG. 6 shows TFE AF 48 over a Al 46 layer. In addition, other solutions with ZFSNF can then be deposited over the patterned TFE AF.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A method of forming an TFE AF layer in a device, comprising:
   a. depositing said TFE AF layer on a substrate;
   b. combining a fluorosurfactant with a first material to produce a second material; and
   c. depositing said second material on said TFE AF layer.

2. The method of claim 1, wherein said method further includes:
   a. patterning and etching said second material;
   b. removing said second material; and
   c. forming a third material on said TFE AF layer.

3. The method of claim 2, wherein said forming said third material comprises forming a metal layer.

4. The method of claim 2, wherein said forming said third material comprises forming a semiconductor layer.

5. The method of claim 1, wherein said combining comprises combining a ZFSNF fluorosurfactant with a masking substance.

6. The method of claim 1, wherein said method further includes heating said TFE AF layer before depositing said second material on said TFE AF layer.

7. The method of claim 1, wherein said method further includes depositing a second coating of said second material on said TFE AF layer.

8. The method of claim 1, wherein said method further includes heating said TFE AF and depositing a second coating of said second material on said TFE AF layer.

9. A method of forming an TFE AF layer in a device, comprising:

a. depositing said TFE AF layer on a substrate;
b. combining a fluorosurfactant with a first material to produce a second material;
c. depositing said second material on said TFE AF layer;
d. patterning and etching said second material; and
e. removing said second material.

10. The method of claim 9, wherein said method further includes forming a metal layer on top of said TFE AF layer.

11. The method of claim 9, wherein said method further includes forming a semiconductor layer on top of said TFE AF layer.

12. The method of claim 9, wherein said combining comprises combining a ZFSNF fluorosurfactant with photoresist.

13. The method of claim 9, wherein said method further includes heating said TFE AF layer before depositing said second material on said TFE AF layer.

14. The method of claim 9, wherein said method further includes depositing a second coating of said second material on said TFE AF layer.

15. The method of claim 9, wherein said method further includes heating said TFE AF and depositing a second coating of said second material on said TFE AF layer.

* * * * *